United States Patent
Mandelman et al.

(10) Patent No.: US 6,441,422 B1
(45) Date of Patent: Aug. 27, 2002

(54) STRUCTURE AND METHOD FOR ULTRA-SCALABLE HYBRID DRAM CELL WITH CONTACTED P-WELL

(75) Inventors: Jack A. Mandelman, Stormville; Ramachandra Divakaruni, Somers; Carl J. Radens, LaGrangeville; Jai-hoon Sim, Wappingers Falls, all of NY (US)

(73) Assignee: International Business Machines Corporation, Armonk, NY (US)

( * ) Notice: Subject to any disclaimer, the term of this patent is extended or adjusted under 35 U.S.C. 154(b) by 20 days.

(21) Appl. No.: 09/706,482

(22) Filed: Nov. 3, 2000

(51) Int. Cl.$^7$ .............................................. H01L 27/108
(52) U.S. Cl. ..................... 257/300; 257/301; 257/302; 257/330
(58) Field of Search ................. 257/300, 301, 257/302, 330

(56) References Cited

U.S. PATENT DOCUMENTS

| | | | | |
|---|---|---|---|---|
| 4,864,374 A | * | 9/1989 | Banerjee ..................... 357/23.6 |
| 4,873,560 A | * | 10/1989 | Sunami et al. ............. 357/23.6 |
| 4,988,637 A | * | 1/1991 | Dhong et al. ................. 437/52 |
| 5,198,383 A | * | 3/1993 | Teng et al. .................... 437/47 |
| 5,225,697 A | * | 7/1993 | Malhi et al. ................. 257/302 |
| 5,363,327 A | * | 11/1994 | Henkles et al. ............. 365/149 |
| 5,369,049 A | * | 11/1994 | Acocella et al. .............. 437/52 |
| 5,519,236 A | * | 5/1996 | Ozaki ......................... 257/302 |
| 6,074,909 A | * | 6/2000 | Gruening .................... 438/242 |
| 6,093,614 A | * | 7/2000 | Gruening et al. ........... 438/388 |
| 6,184,549 B1 | * | 2/2001 | Furukawa et al. .......... 257/302 |
| 6,190,971 B1 | * | 2/2001 | Gruening et al. ........... 438/270 |
| 6,204,140 B1 | * | 3/2001 | Gruening et al. ........... 438/386 |

* cited by examiner

Primary Examiner—Eddie Lee
Assistant Examiner—Eugene Lee
(74) Attorney, Agent, or Firm—Scully, Scott, Murphy & Presser; Todd M. C. Li

(57) ABSTRACT

An ultra-scalable hybrid memory cell having a low junction leakage and a process of fabricating the same are provided. The ultra-scalable hybrid memory cell contains a conductive connection to the body region therefore avoiding isolation of the P-well due to cut-off by the buried strap outdiffusion region. The ultra-scalable hybrid memory cell avoids the above by using a shallower than normal isolation region that allows the P-well to remain connected to the body of the memory cell.

14 Claims, 20 Drawing Sheets

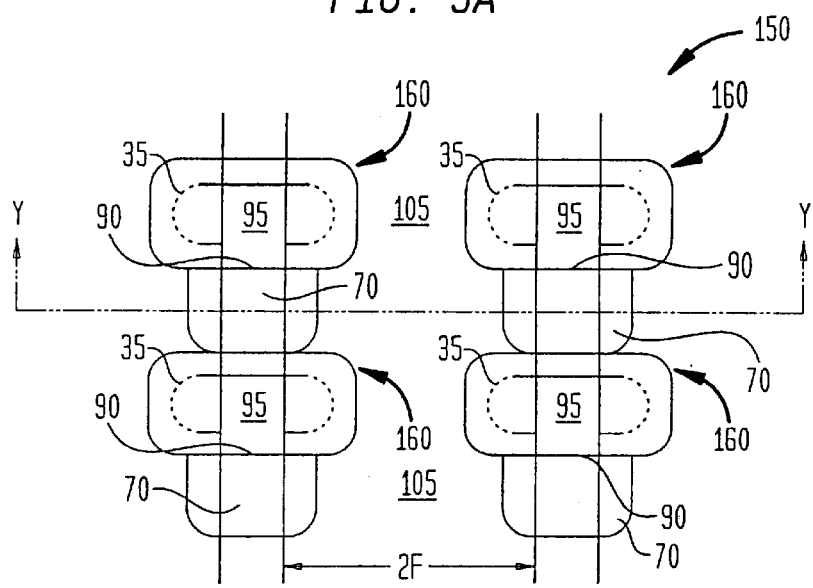
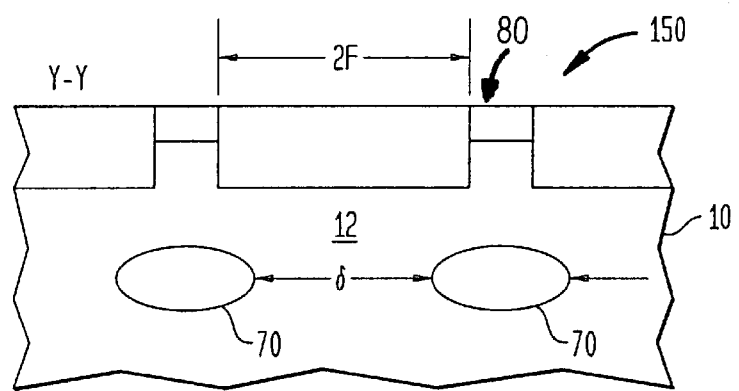
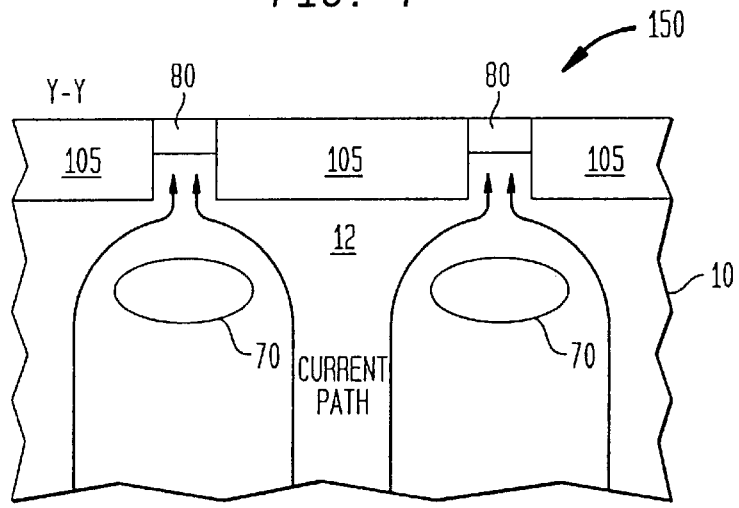

STRUCTURE AND METHOD FOR ULTRA-SCALABLE HYBRID DRAM CELL WITH CONTACTED P-WELL

RELATED APPLICATIONS

This application is related to co-assigned U.S. patent applications Ser. Nos. 09/705,652 and 09/706,468, both of which are filed concurrently with this application.

FIELD OF THE INVENTION

The present invention relates to semiconductor memory cell arrays, and more particular to a hybrid dynamic random access memory (DRAM) cell array which is ultra-scalable to a minimum feature size, F, of about 60 nm at an operating voltage of $V_{blh}$ of about 1.5 V. The present invention also relates to a processing scheme that is capable of forming the above-mentioned hybrid DRAM cell array.

BACKGROUND OF THE INVENTION

As conventional vertical DRAM cells are scaled below a design groundrule of about 110 nm, encroachment of the buried-strap region upon the sidewall of the adjacent storage trench cuts-off the path holes flowing into and out of the portion of the P-well above the buried-strap region.

Simulation has demonstrated that floating-well effects limit the scalability of prior art vertical DRAM memory arrays to a minimum distance of about 90 nm between adjacent storage trenches. A number of dynamic leakage mechanisms limiting the scalability of conventional vertical DRAM memory cells have been identified and quantified. Included in the dynamic leakage mechanisms are: (1) Floating-well bitline disturb (FWBD), (2) Transient drain induced barrier lowering (TDIBL), and (3) Adjacent wordline induced punchthrough (AWIPT).

The onset of serious charge loss due to each mechanism occurs at approximately 90 nm end of process deep trench (DT) to deep trench (DT) spacing. Thus, scalability of conventional vertical DRAM memory cells beyond 110 nm is expected to be limited by floating-well effects.

An illustration of a dominant floating-well dynamic leakage mechanism that limits scalability of prior art vertical DRAM memory arrays is shown in FIG. 1. Specifically, at a time indicated by point A of FIG. 1 and during a long period of about 5–100 ns of repeated writing of a "1" to other memory cells on the bitline, the P-well of an unselected cell storing a "1" may leak up towards $V_{blh}$, as the exiting of holes is restricted by parasitic JFET. Leakage depends on the degree of well isolation caused by pinchoff from expansion of the storage node depletion region. In an extreme case, the buried-strap region may come in contact with the adjacent deep trench capacitor. Moreover, the hole current through the pinchoff region must keep up with the leakage to avoid a pseudo "Floating-Body Effect".

Insofar as time interval B–C is concerned, the N+ bitline diffusion to P-well barrier is lowered by a downward swing of $V_{blh}$. Electrons emitted from the bitline diffusion region are collected by the storage node resulting in the formation of a parasitic bipolar transistor, $Q_B$, ($PW_{int}$ is a floating base) within the memory cell array.

For aggressively scaled vertical metal oxide semiconductor field effect transistors (MOSFETs) in prior art vertical DRAM memory cells, the depletion region from the storage node diffusion (i.e., buried-strap outdiffusion) encroaches upon the sidewall of the adjacent storage trench, which results in dynamic charge loss from the storage capacitor as the bitline of an unselected device is cycled. This charge loss mechanism is identical to that published in "Floating-Body Concerns for SOI Dynamic Random Access Memory (DRAM)",. Proceedings, 1996 IEEE International SOI Conference, Jack Mandelman, et al. pp. 1367–137, Oct. 1996.

An illustration of the storage capacitor voltage vs. the voltage in the portion of the P-well isolated by the depletion region from the buried-strap outdiffusion, as the bitline is cycled, is shown in FIG. 2. When the bitline is held at $V_{blh}$, the isolation portion of the P-well leaks up towards the voltage of the adjacent diffusions. With subsequent cycling of the bitline between 0.0 and $V_{blh}$, the dynamic charge loss mechanism results in charge pumping which discharges the storage capacitor. Between data refresh, greater than $10^6$ bitline cycles are possible, which is sufficient to discharge the storage capacitor.

One possible solution to the scalability limitation resulting from floating-well effects, which has not yet been implemented in existing memory structures, includes a contact to the portion of the P-well above the buried-strap outdiffusion region. If such a memory structure is possible, it must be provided in a manner that does not negatively impact cell density, does not degrade junction leakage, and does not add to the fabrication complexity. To date, applicants are unaware of a prior art vertical DRAM memory structure of this type that overcomes the scalability limitation resulting from floating-well effects.

The present invention provides a memory cell structure and processing scheme that provides a contacted body and maintains low junction leakage, while actually reducing fabrication cost, retarding the onset of scalability limitations due to floating-well effects to approximately 60 nm groundrules.

SUMMARY OF THE INVENTION

One object of the present invention is to provide a hybrid memory cell array ($6F^2$), which avoids strap-to-strap leakage problems to a minimum feature size, F, of about 60 nm at operating voltages of $V_{blh}$ of about 1.5 V.

Another object of the present invention is to provide a hybrid memory cell array wherein the floating-well effects are substantially eliminated.

A further object of the present invention is to provide a hybrid memory cell array that has tighter support groundrules.

A still further object of the present invention is to provide a hybrid memory cell array in which low-aspect ratio shallow isolation trench (SIT) regions are employed.

A yet further object of the present invention is to provide a hybrid memory cell array having improved narrow width effects.

An even further object of the present invention is to provide a hybrid memory cell array wherein the spaces between the SIT regions may be greater than 1 F without critical overlay in the array.

These and other objects and advantages are achieved in the present invention by providing a vertical DRAM memory cell array in which a contact to the P-well above the buried-strap outdiffusion region is provided. Specifically, the inventive hybrid memory cell array comprises:

a plurality of vertical memory cells which are arranged in rows and columns, each vertical memory cell being formed in a storage trench that is present in a P-well of a Si-containing substrate and each vertical memory cell includes a MOSFET region formed over a storage capacitor, said MOSFET region and said storage capacitor being electrically connected by a one-sided buried-strap outdiffusion region, said one-sided buried-strap outdiffusion region being confined to a substantially center portion of the storage trench; and shallow isolation trench regions located between adjacent columns of memory cells, each of said shallow isolation trench regions having a depth that is substantially above said one-sided buried-strap outdiffusion region thereby not cutting into said one-sided buried-strap outdiffusion region, yet being deep enough to isolate adjacent bitline diffusion regions that abut each vertical DRAM cell.

The inventive memory cell array also includes wordlines that are formed above each vertical DRAM cell, borderless bitline contacts that are in contact with said bitline diffusion regions and bitlines that are formed above and perpendicular to the wordlines. In one embodiment of the present invention, the bitlines have approximately a 3 F pitch associated therewith and the cell is approximately a 6 $F^2$ memory cell.

The present invention also provides a process of fabricating the above-mentioned memory cell array. Specifically, the inventive process includes the steps of:

(a) forming at least one deep trench capacitor in a Si-containing substrate, said deep trench capacitor including at least a:deep trench polysilicon material;

(b) patterning said deep trench polysilicon material using at least a hard mask to cover a middle portion of the deep trench capacitor and selectively recessing exposed portions of said deep trench polysilicon material to a depth below that of a strap opening to be subsequently formed;

(c) filling said recessed portion of said deep trench polysilicon material with an oxide and planarizing said oxide stopping on said hard mask;

(d) removing said hard mask to expose said middle portion of said deep trench capacitor and selectively etching the exposed deep trench polysilicon material to a depth that is above said oxide fill;

(e) filling said etched middle portion with a photoresist material and planarizing said photoresist material stopping on said substrate;

(f) removing said photoresist material from said middle portion of said deep trench capacitor so as to expose a portion of said deep trench polysilicon material and selectively forming bitline diffusion regions about said deep trench capacitor above regions wherein said strap opening will be subsequently formed;

(g) providing said strap opening in said deep trench capacitor and forming a one-sided buried-strap outdiffusion region through said strap opening, said one-sided buried-strap outdiffusion region being confined to a substantially center portion of the deep trench capacitor;

(h) forming a trench oxide layer on said exposed portion of said deep trench polysilicon material and forming a gate conductor on said trench oxide layer; and (i) forming shallow isolation trench regions adjacent to said deep trench capacitor, wherein said shallow isolation trench regions have a depth that is substantially above said one-sided buried-strap outdiffusion region thereby not cutting into said one-sided buried-strap outdiffusion region, yet being deep enough to isolate adjacent bitline diffusion regions that abut each vertical DRAM cell.

The inventive process further includes forming wordlines above said deep trench capacitor, forming borderless bitline contacts adjacent to said wordlines and forming bitlines above and perpendicular to said wordlines that are in contact with said bitline contacts.

In one embodiment of the present invention, the one-sided buried-strap outdiffusion region is formed earlier in the process. Specifically, in that embodiment of the present invention, steps (a)–(d) are first performed, then step (g) is performed followed by steps (e), (f), (h) and (i).

BRIEF DESCRIPTION OF THE DRAWINGS

FIGS. 3A–B are pictorial representations of a portion of the inventive hybrid memory cell.

FIG. 4 is an illustration showing the electrical continuity to the upper portion of the P-well of the inventive hybrid memory cell.

FIG. 5A is a graph of mid-band electron potential (V) vs. lateral distance ($\mu$m); while

In FIGS. 6–15, top views are shown as well as cross-sectionals through various cuts including through the deep trench region, Y1—Y1; and through the SIT region, Y2—Y2. In some instances, cut X—X which represents a cross-section perpendicular to Y1—Y1 and Y2—Y2, in a plane containing both storage trench and body of the vertical MOSFET, is shown.

DETAILED DESCRIPTION OF THE INVENTION

Figure 1:
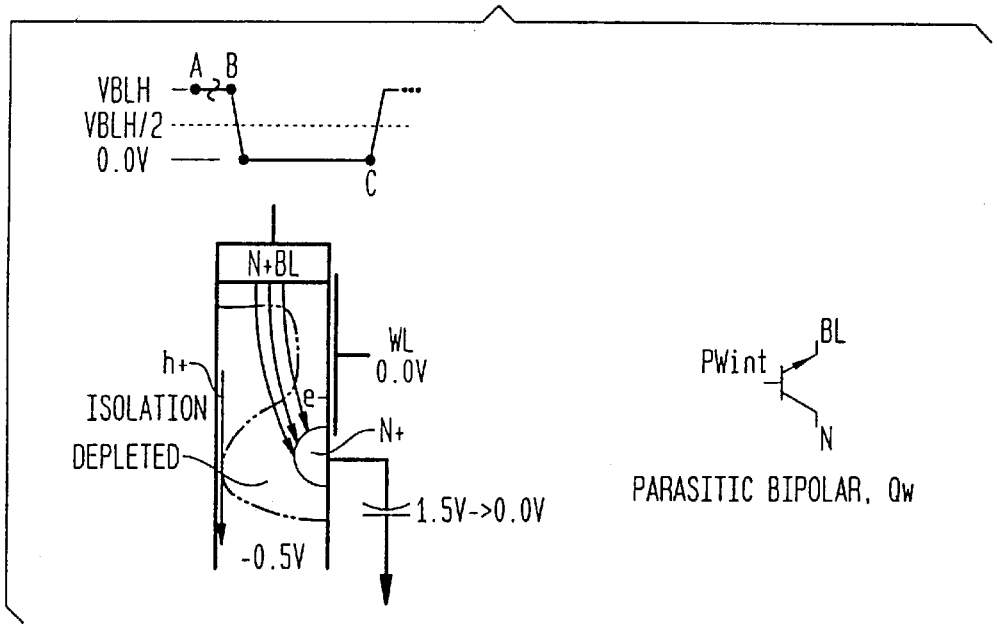
FIG. 1 is a schematic that explains the floating well-effects in a conventional hybrid memory cell.
Figure 2:
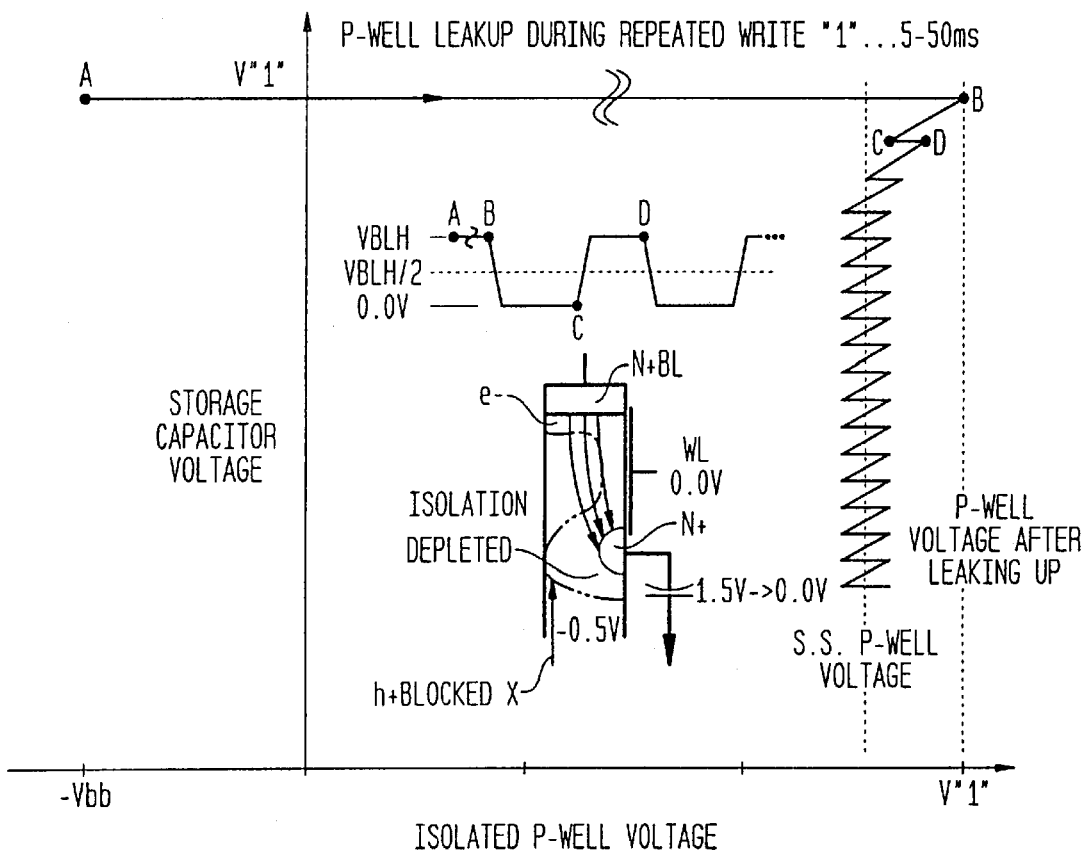
FIG. 2 is an illustration of storage capacitor charge loss with repeated bitline cycling in an unselected conventional hybrid memory cell.

The present invention which provides a hybrid dynamic random access memory (DRAM) cell array which avoids stored charge loss due to floating-well effects to a minimum feature size, F, of about 60 nm at an operating voltage of $V_{blh}$ of about 1.5 V and a method of fabricating the same will now be described in greater detail by referring to the drawings that accompany the present application.

Reference is made to FIGS. 3A–B which illustrate a portion of inventive ultrascalable hybrid memory cell array. Specifically, FIG. 3A is a top view of the inventive hybrid memory cell array 150 which includes a plurality of vertical DRAM cells 160 arranged in rows and columns. In FIG. 3A, the illustrated elements of the vertical DRAM include gate conductor 95, gate oxide 90 and collar oxide 35 which is formed entirely around the perimeter of the gate conductor except for a small aperture in which buried-strap region 70 and channel of the vertical MOSFET are present. In accordance with the present invention, each vertical memory cell, i.e., DRAM, is formed in a storage trench that is present in a P-well 12 of a Si-containing substrate 10 and each vertical memory cell includes a MOSFET region formed over a storage capacitor. The MOSFET region and the storage capacitor of the inventive memory cell array are electrically connected to each other by a one-sided buried-strap outdiffusion region 70. The one-sided buried-strap outdiffusion region is confined to a substantially center portion of the storage trench and it may extend essentially to the adjacent vertical memory cell present in the same column.

The memory cell shown in FIG. 3A also includes shallow isolation trench (SIT) regions 105 located between adjacent columns of memory cells. In accordance with the present invention, each shallow isolation trench region has a depth that is substantially above the one-sided buried-strap out-diffusion region thereby not cutting into the one-sided buried-strap outdiffusion region, yet being deep enough to isolate adjacent bitline diffusion regions that abut each vertical memory cell; See FIG. 3B.

Specifically, FIG. 3B is a cross-sectional view of the hybrid memory cell through cut Y—Y, i.e., the N+ buried-strap diffusion region. As shown, the hybrid memory cell includes SIT regions 105 which are formed in a P-well region 12 of a Si-containing substrate 10. Bitline diffusion regions 80 are located in the P-well region between each STI region. Beneath each bitline diffusion, is buried-strap out-diffusion region 70.

It should be noted that there are several novel features contained in the above cell which allow a contact to the P-well (above the strap) to be formed without impacting junction leakage, cell area and fabrication cost. Included are (1) The collar oxide covers the entire perimeter of the top portion of the storage trench except for approximately a 1 F wide opening which contains the strap and gate oxide of the vertical metal oxide semiconductor field effect transistor (MOSFET); and (2) The shallow isolation trench regions, e.g., SIT regions, are just deep enough to cut the bitline diffusion (and the source/drain diffusions in the support circuitry, not shown). In the inventive hybrid memory cell array, the bottom of the SIT is substantially above the top portion of the strap diffusion. This means that a greatly reduced aspect ratio SIT may be used in the supports circuitry as well as the array, facilitating etching and filling, while allowing tighter groundrules. Furthermore, since the bottom of the SIT region is now well above the strap diffusion, sub-trench isolation leakage is better controlled with a higher doping concentration without increasing the background doping at the strap.

As shown in FIG. 4, electrical continuity between the deep portion of the P-well (biased at $V_{bb}$, typically −0.5 V) and the portion of the P-well above the strap is obtained by hole flow around the depletion region surrounding the strap diffusion. In accordance with the present invention, the SIT regions are sufficiently shallow (greater than 40 nm above the strap diffusion junction) to allow a non-depletion portion of the P-well to remain between the strap diffusion and the bottom of the SIT. Since the conductive region which provides P-well continuity is original single crystal silicon, junction leakage due to a depletion region abutting a poly-crystalline contact is not a concern.

An additional benefit resulting from shallower isolation regions, i.e., SIT regions, is that the space between SIT regions may be greater than about 1 F, eliminating critical overlay, since strap aperture (i.e., opening) is no longer defined by the isolation trench. This allows for relaxed groundrules and larger bitline contact area. One remaining question which needs to be addressed is how close (δ) may the adjacent strap diffusion be without exceeding a punch-through current of about 1 fA/$\mu$m.

Figure 5A:
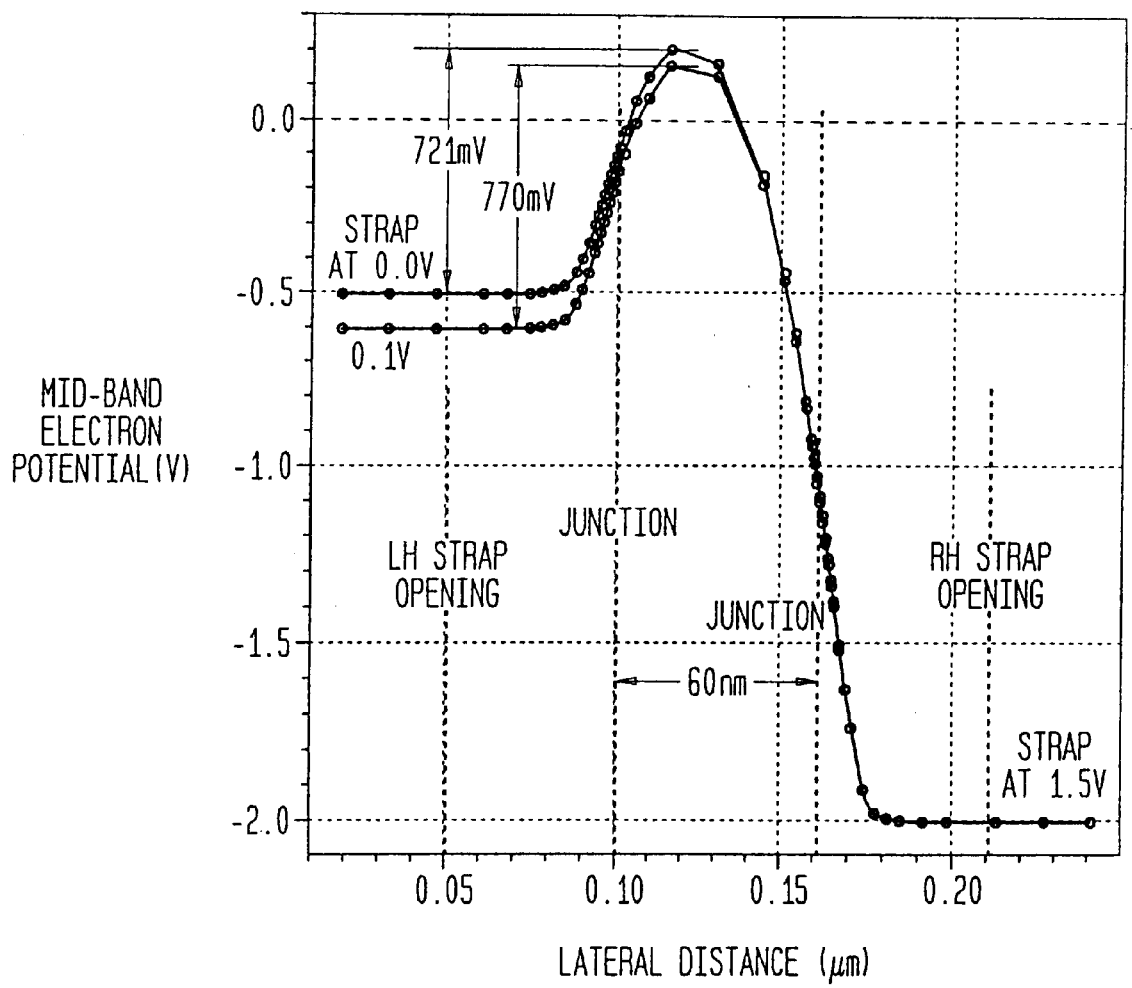
Figure 5B:
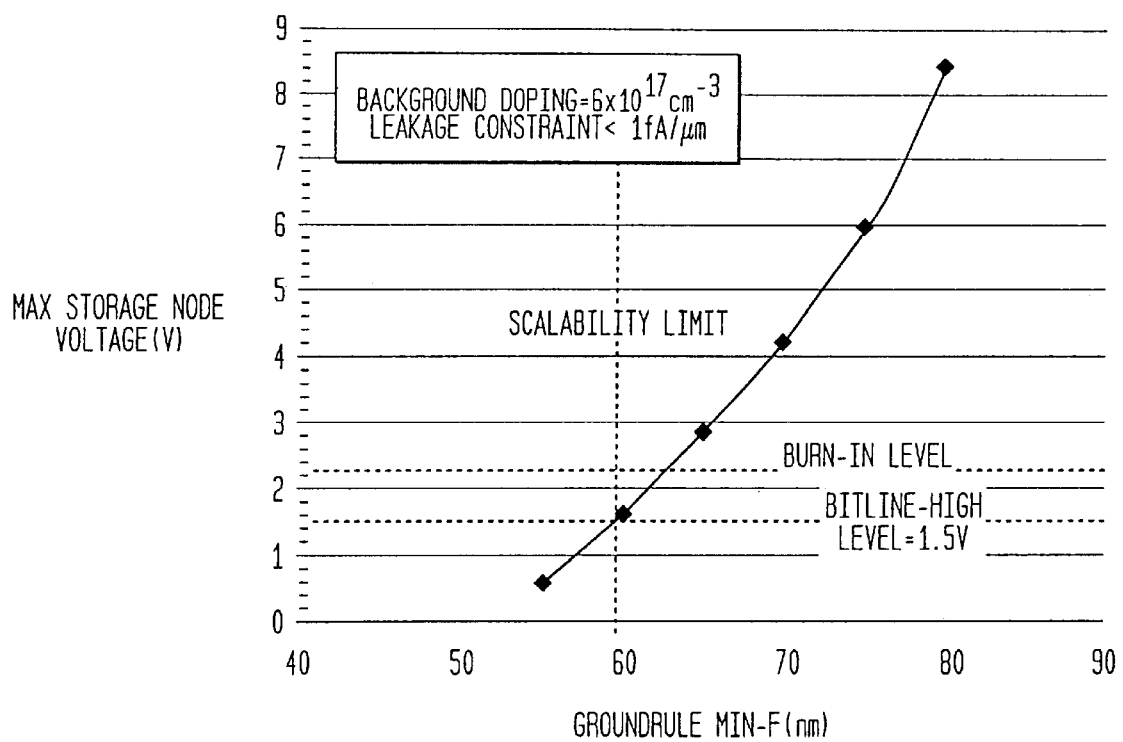
FIG. 5B is a graph of maximum storage node voltage (V) vs. groundrule minimum-F (nm).

Simulations have demonstrated that, with the thermal budget practiced for conventional hybrid cells of the prior art, the amount of strap outdiffusion normal to the sidewall of the storage trench can easily be limited by approximately 50 nm. It has been further found that the amount of diffusion tangential to the sidewall of the storage trench is approximately 30 nm. Using the above value for tangential outdiffusion, and referring again to FIG. 3, applicants have deduced that a spacing between strap diffusions, δ, of about 2 F−60 nm, wherein F is the minimum feature size, can be employed. As can be seen from the simulated potential between straps in FIG. 5A, lowest strap-strap punchthrough barrier occurs when the low-node is zero, for a constant voltage on the adjacent strap, due to drain induced barrier lowering. This means that the highest strap-strap leakage occurs when a "1" is stored on one node and 0.0 V on the adjacent node. FIG. 5B plots simulated results of the maximum voltage which can be applied to one strap diffusion (storage node voltage), with the adjacent strap diffusion held at zero volts, to produce a leakage current of about 1 fA/$\mu$m, as a function of the feature size, F. The empirical P-well doping constraint of about $6 \times 10^{17} cm^3$ has been applied to assure that the tail of retention time distribution is not degraded by defect enhanced junction leakage. As can be seen in FIG. 5B, the leakage constraint is satisfied for a stored "1" of about 1.5 V for a design groundrule smaller than about 60 nm. This corresponds to a diffusion spacing (δ) of about 58 nm. Therefore, acceptable diffusion to diffusion leakage obtained without the usage of prior art isolation trenches, i.e., STIs, for spacing smaller than about 60 nm, which is an unexpected result that enables extreme scaling of the inventive hybrid cell. The processing scheme, which is employed in the present invention in fabricating the above-described ultra-scalable hybrid memory cell, will now be described in detail by referring to FIGS. 6–15 which illustrate the various processing steps of the present invention. As stated above, top views are shown as well as cross-sectional views through various cuts including through the deep trench region, Y1–Y1, through the SIT region, Y2–Y2, and through the deep trench and vertical MOSFET body region, Reference is first made to FIGS. 6A (top view) and 6B (cross-sectional through cut Y1–Y1) which illustrate the deep trench capacitor of the inventive hybrid memory cell array. It is noted that only the upper region (above the node dielectric) of the storage trench is shown in this figure. Specifically, the deep trench capacitor structure shown in FIGS. 6A–B includes a Si-containing substrate 10 having at least one deep trench region 15 formed therein. The term "deep trench" is used herein to denote a trench whose depth from the top surface of the Si-containing substrate is greater than about 1.0 $\mu$m. The capacitor structure also includes a horizontal pad SiN layer 20 and an oxide layer 25 formed on the pad SiN layer. In accordance with the practice of the present invention, the oxide layer is comprised of densified TEOS (tetraethylorthosilicate) or a high density plasma deposited (HDP) oxide.

The deep trench region includes a SiN liner 30 which lines the interior walls (sidewalls of the upper portion) of the deep trench, a collar oxide region 35 formed in a portion of said deep trench on said SiN liner, and deep trench polysilicon 40 which fills the deep trench. It emphasized herein that oxide layer 25 serves as a hard mask for subsequent etching of a portion of the deep trench polysilicon. It should be noted that SiN liner 30 may be replaced with other types of liner materials which can also serve as an etch stop layer.

Figure 6A:
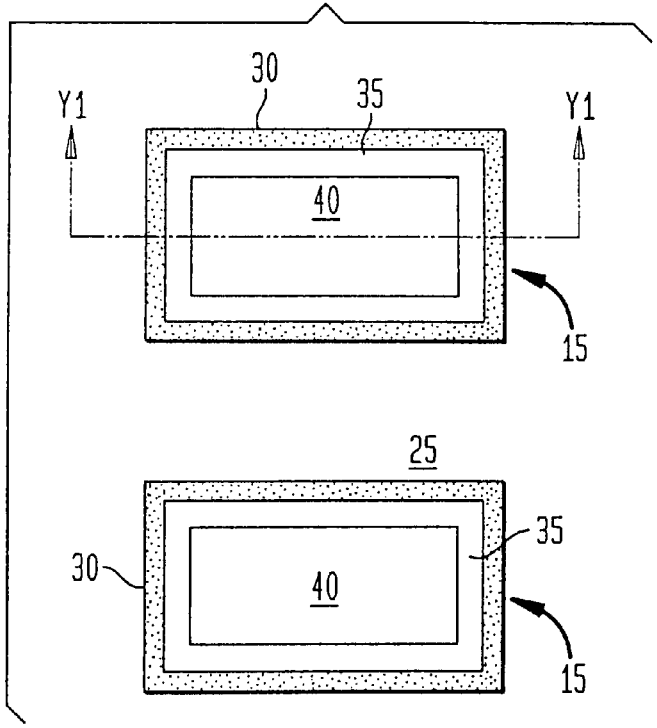
FIGS. 6–15 are pictorial views illustrating the inventive hybrid memory cell through various processing steps of the present invention.
Figure 6B:
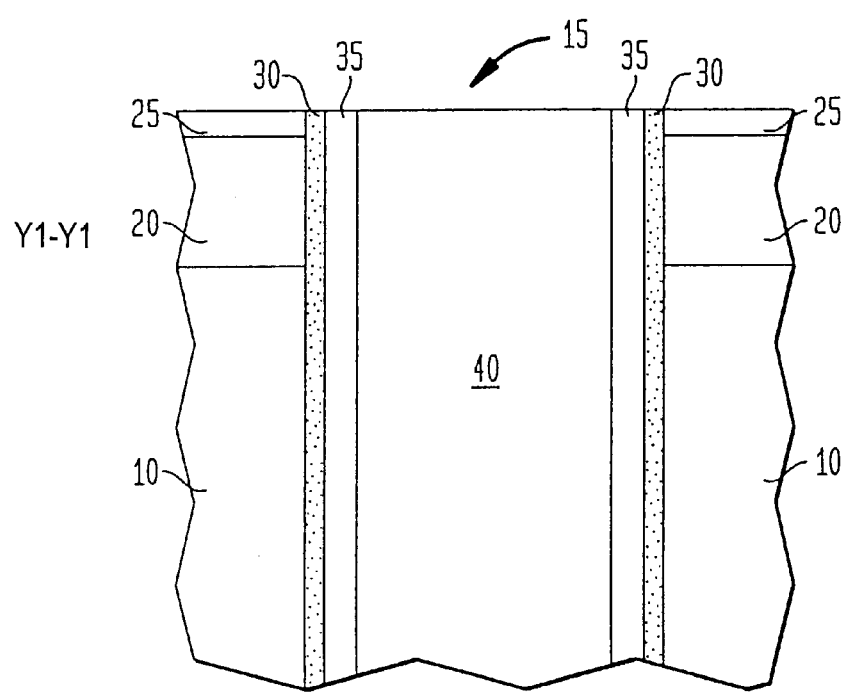
Figure 7A:
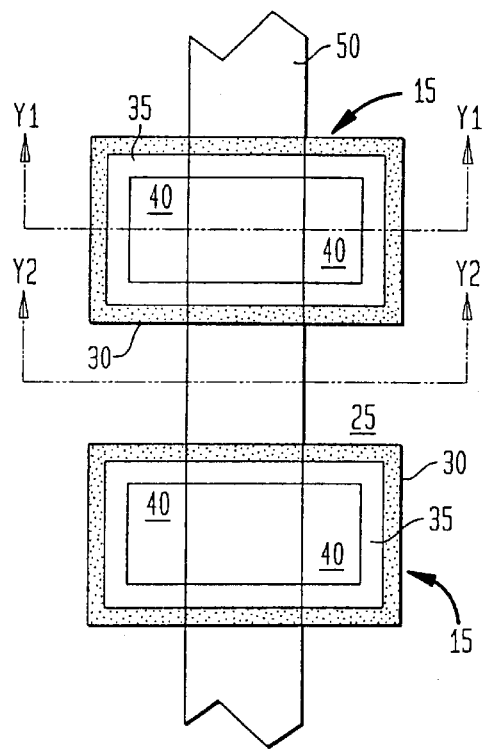
Figure 7B:
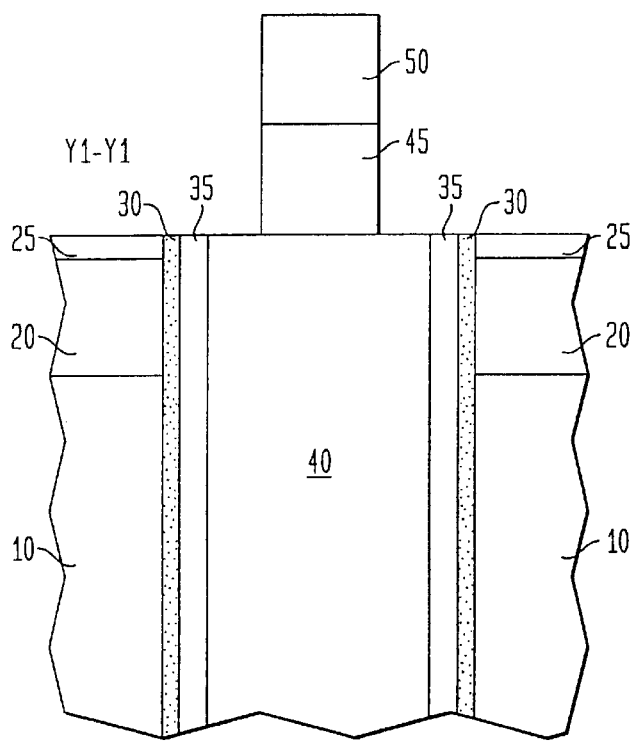
Figure 7C:
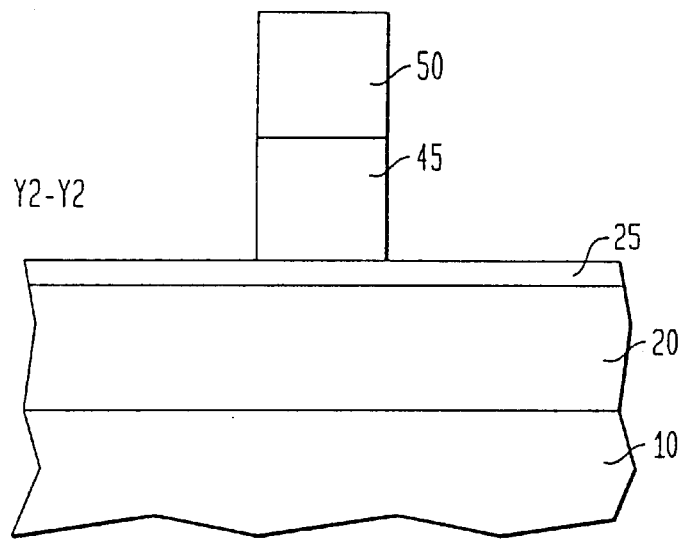
Figure 8A:
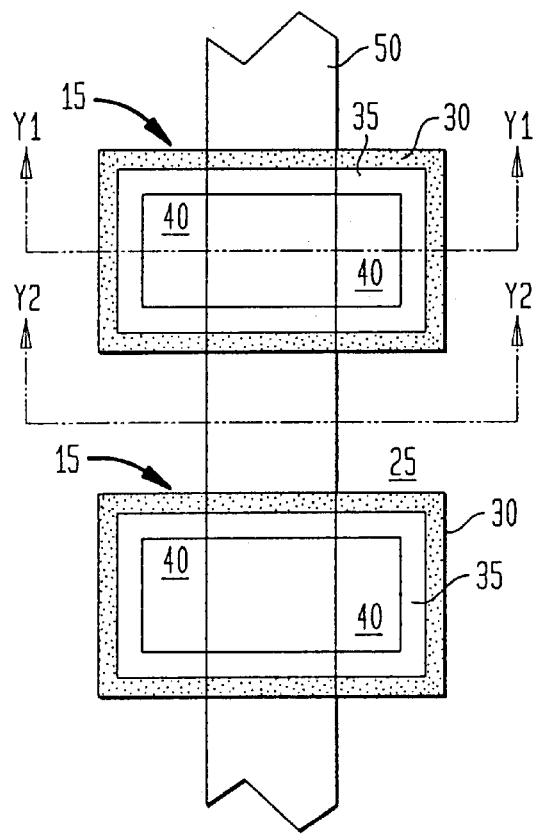
Figure 8B:
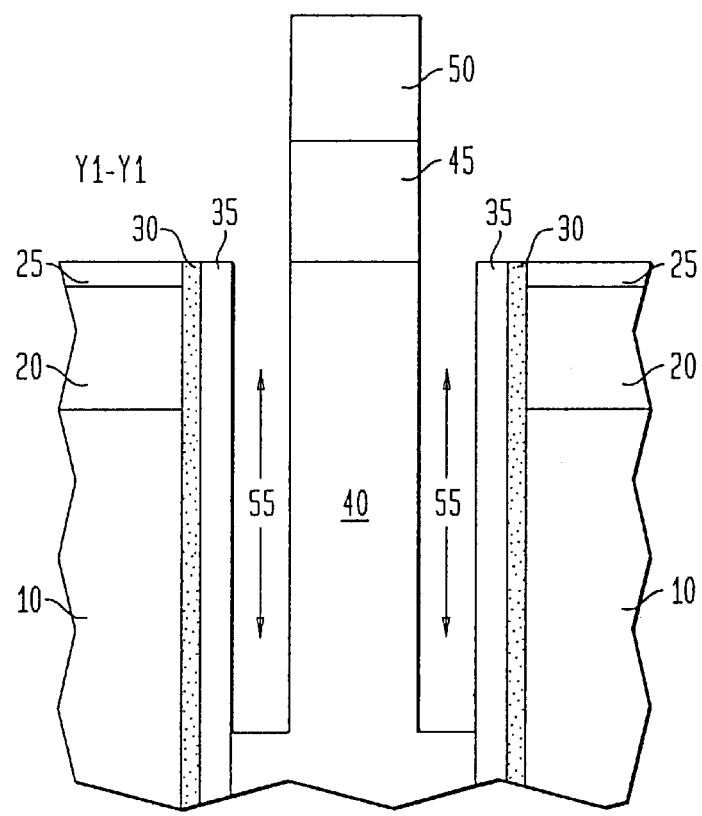
Figure 8C:
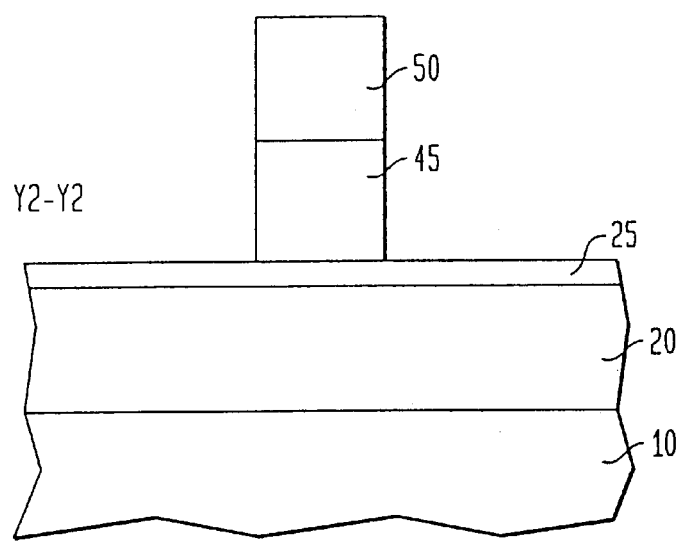
Figure 9A:
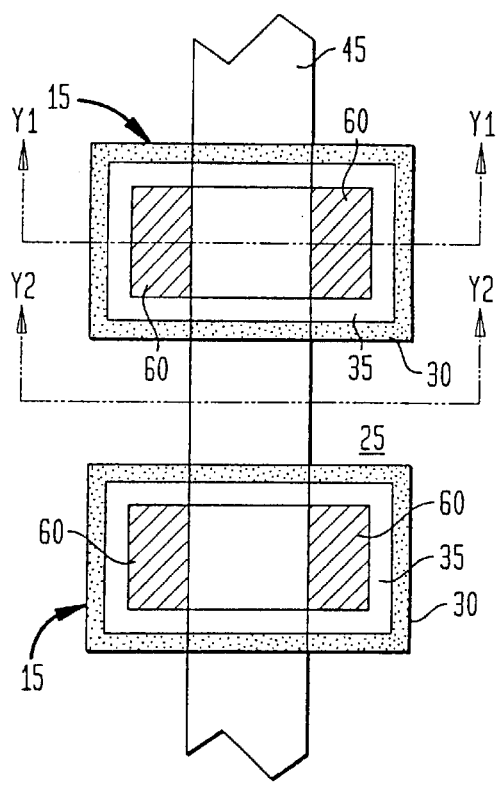
Figure 9B:
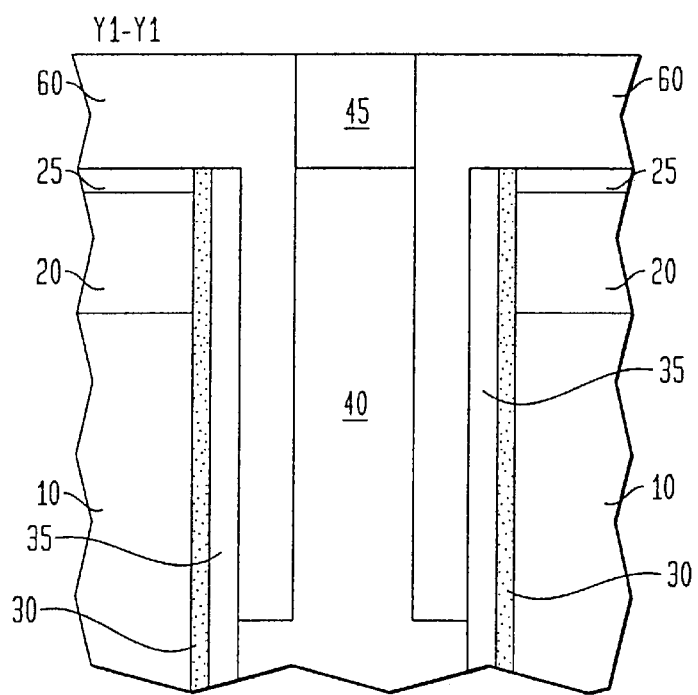
Figure 9C:
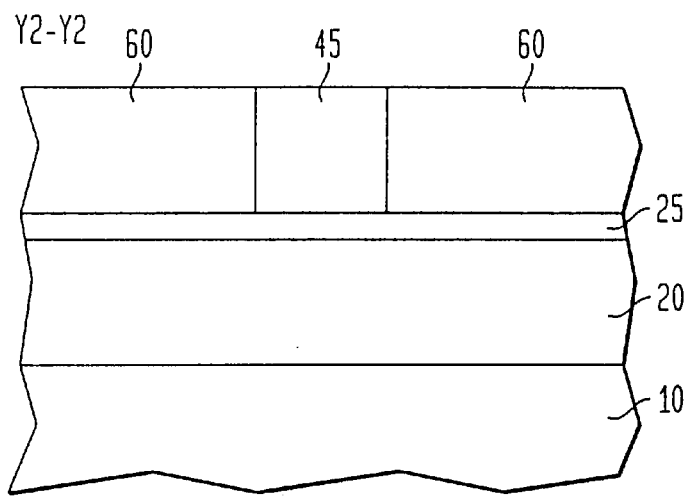
Figure 10A:
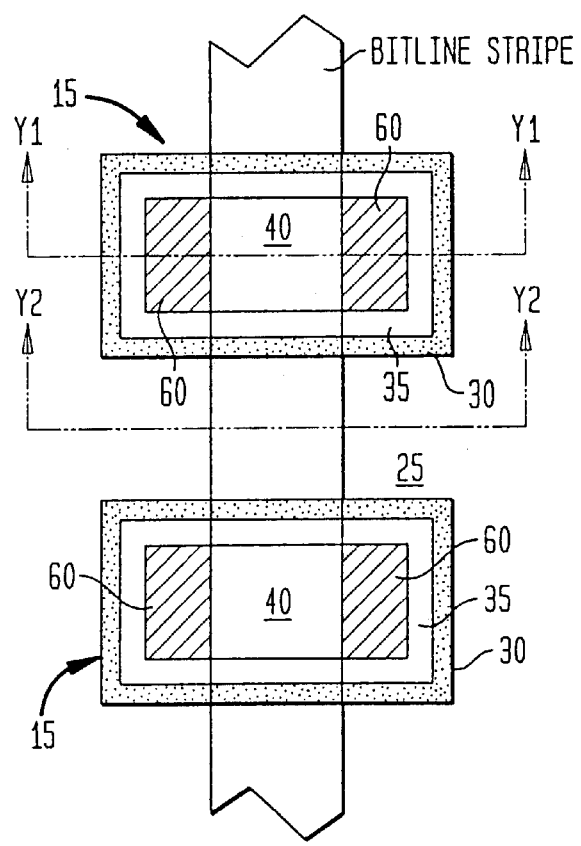
Figure 10B:
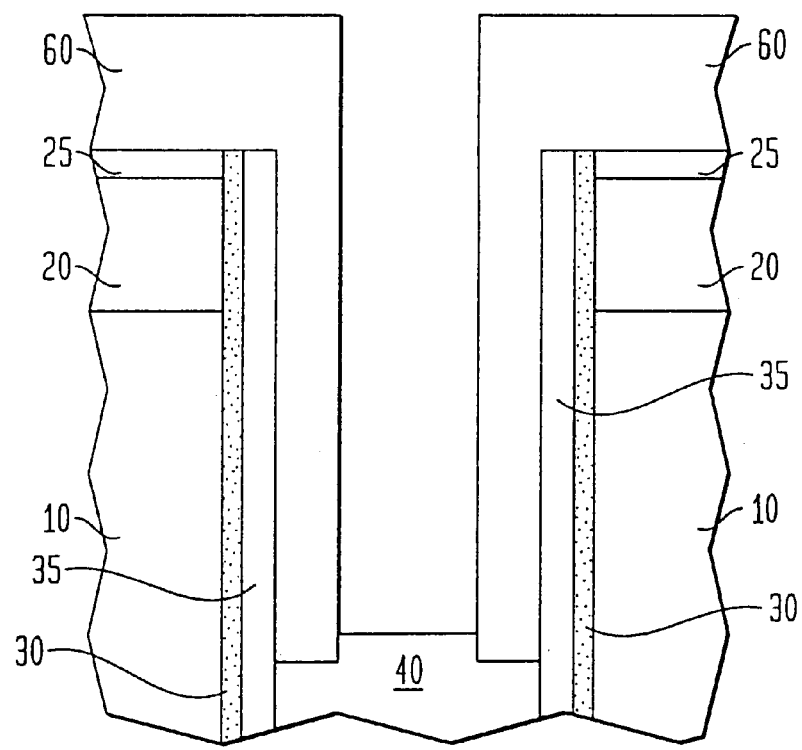
Figure 10C:
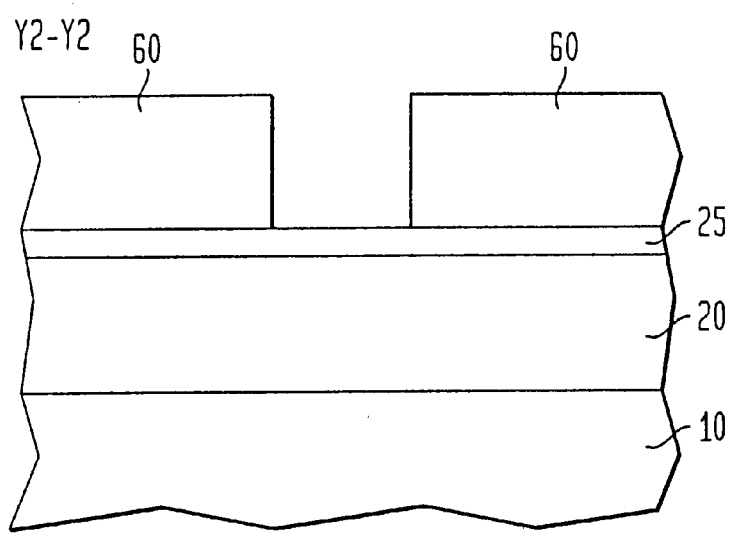

The deep trench structure shown in FIGS. 6A and 6B is formed as follows: First, a pad structure consisting of a thermally grown thin oxide having a thickness of about 15 nm or less (not shown), a deposited layer of SiN, a layer of densified TEOS or HDP oxide, and a deposited layer of doped silicate glass (not shown) such as boron doped silicate glass (BSG) is formed on the surface of the Si-containing substrate. Deep trench storage capacitors, one of which is shown in the drawings, are then formed in the customarily manner of opening a trench pattern in the pad structure via lithography and anisotropically etching the Si-containing substrate to a predetermined depth. Next, SiN liner 30 is formed on the exposed interior walls of the deep trench. A polysilicon buffer LOCOS (local oxidation of silicon) or other like oxide collar 35 is formed on the SiN liner in the upper portion of the deep trench, a buried plate diffusion (not shown) is formed in the lower portion of the storage trench, a node dielectric (not shown) is formed about said buried plate diffusion and the trench is filled with doped polysilicon which is then planarized to harden the oxide layer. Any remaining doped silicate glass is then stripped from the structure utilizing HF/sulfuric or HF vapor. FIGS. 6A–6B show the resultant structure at this point in the process.

A second layer of SiN 45 is formed on the trench capacitor structure of FIGS. 6A–B by a conventional deposition process such as chemical vapor deposition (CVD) and thereafter photoresist 50 is formed on said second nitride layer. The photoresist is then exposed and patterned into lines and spaces. The intersection of photoresist lines will subsequently define the location of the strap opening and the gate of the vertical MOSFET. Using the photoresist stripes as a mask, the second SiN layer is anisotropically etched selective to $SiO_2$ and silicon, stopping on the oxide layer providing the structure shown in FIGS. 7A, 7B and 7C.

Following definition of the second nitride layer stripes over the array, the exposed deep trench polysilicon is anisotropically etched selective to oxide and photoresist so as to recess the deep trench polysilicon to a depth below the depth of the strap opening to be subsequently formed. This process steps provide the structure shown in FIGS. 8A, 8B and 8C wherein reference numeral 55 denotes the recessed areas formed in deep trench polysilicon 40. After recessing of the exposed deep trench polysilicon to a depth below the strap opening to be subsequently formed, the photoresist is stripped and an oxide fill (TEOS or HDP oxide) 60 is deposited by conventional means and planarized (e.g., chemical-mechanical polishing, CMP) to the top surface of the second nitride stripe, See FIGS. 9A, 9B and 9C. A void free filling process is not required in the present invention, but can be employed. A nitride liner (not shown) may optionally be deposited on the exposed surfaces prior to filling the recess with oxide. The nitride liner, when present, serves to protect the oxide fill from subsequent etching steps and to prevent opening any voids in the oxide fill.

Following deposition and planarization of the CVD oxide, filling the apertures created by the etched deep trench polysilicon, the exposed portion of the second SiN layer is anisotropically etched selective to $Sio_2$ leaving an exposed surface of the deep trench polysilicon. Note all other areas of the structure are protected by oxide. The exposed deep trench polysilicon is then anisotropically etched selective to oxide to a depth which is above the bottom of oxide fill region 60 providing the structure shown in FIGS. 10A, 10B and 10C. At this point in the inventive process, a one-sided strap process may optionally be employed to remove the collar oxide from one side of the storage trench and to form a buried-strap 70 on that side. In the embodiment described herein, the one-sided strap process is deferred until a later point in the inventive process.

Figure 11A:
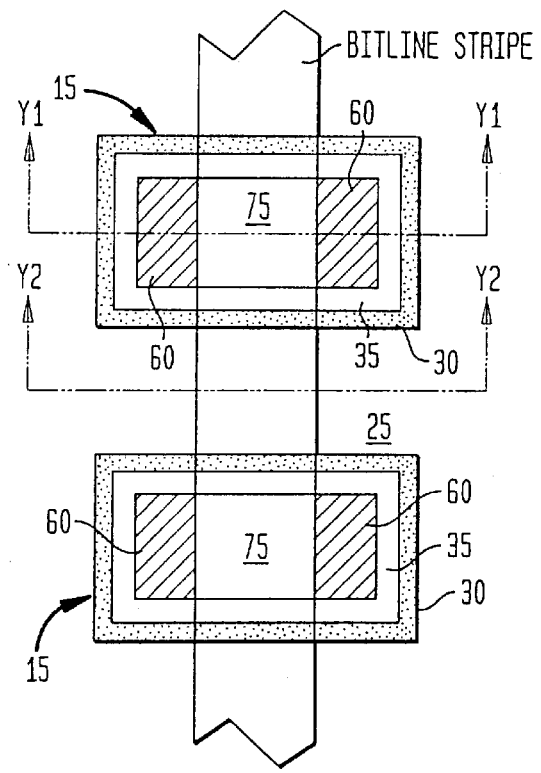
Figure 11B:
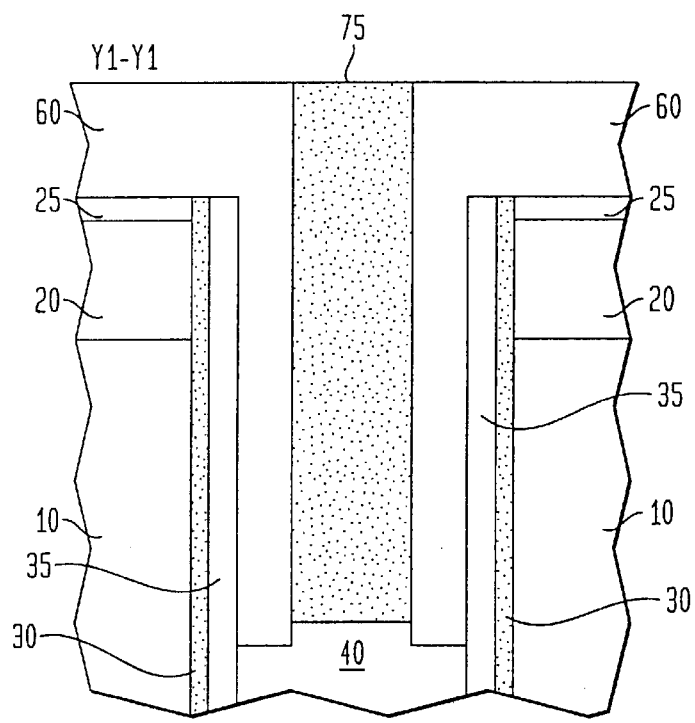
Figure 11C:
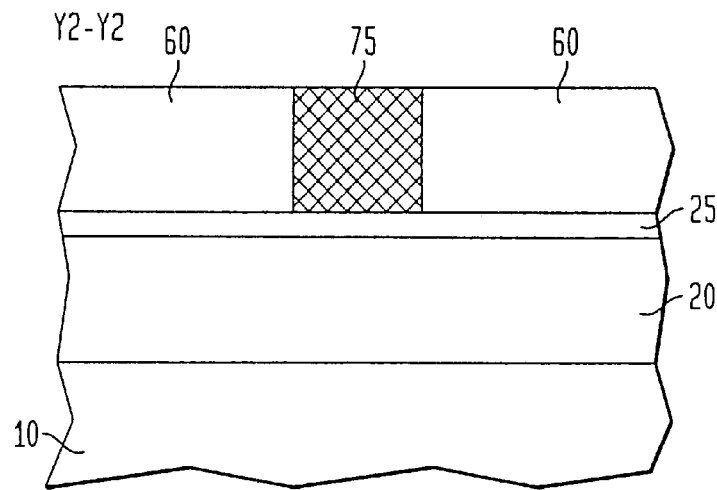

A conventional photoresist fill and planarization process which is well known to those in the art is now employed so as to form the structure shown in FIGS. 11A, 11B and 11C. In these figures, reference numeral 75 denotes the photoresist material. In accordance to the present invention and as shown, the photoresist fills the recesses created by the previous removal of the deep trench polysilicon and the second SiN layer. It is noted that the resist fill and planarization process is employed in the present invention to protect the gate and active area regions from subsequent processing.

Figure 12A:
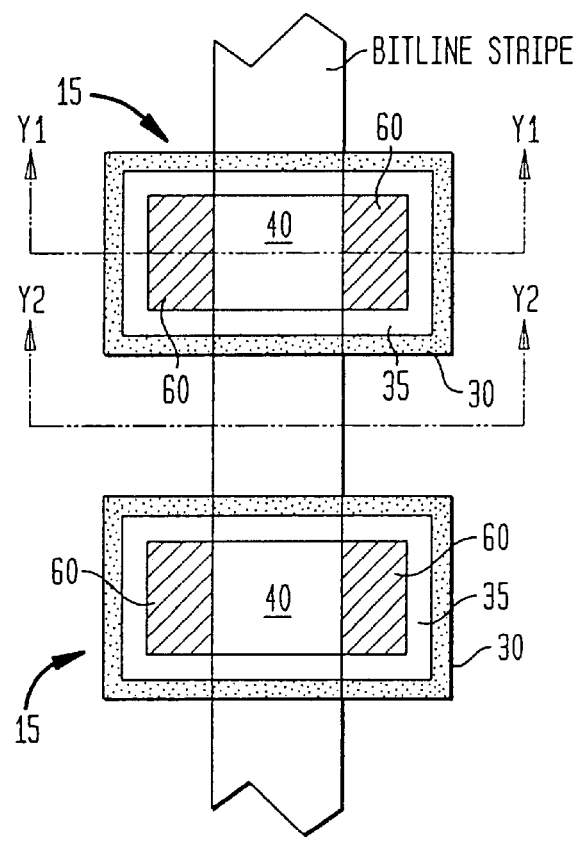
Figure 12B:
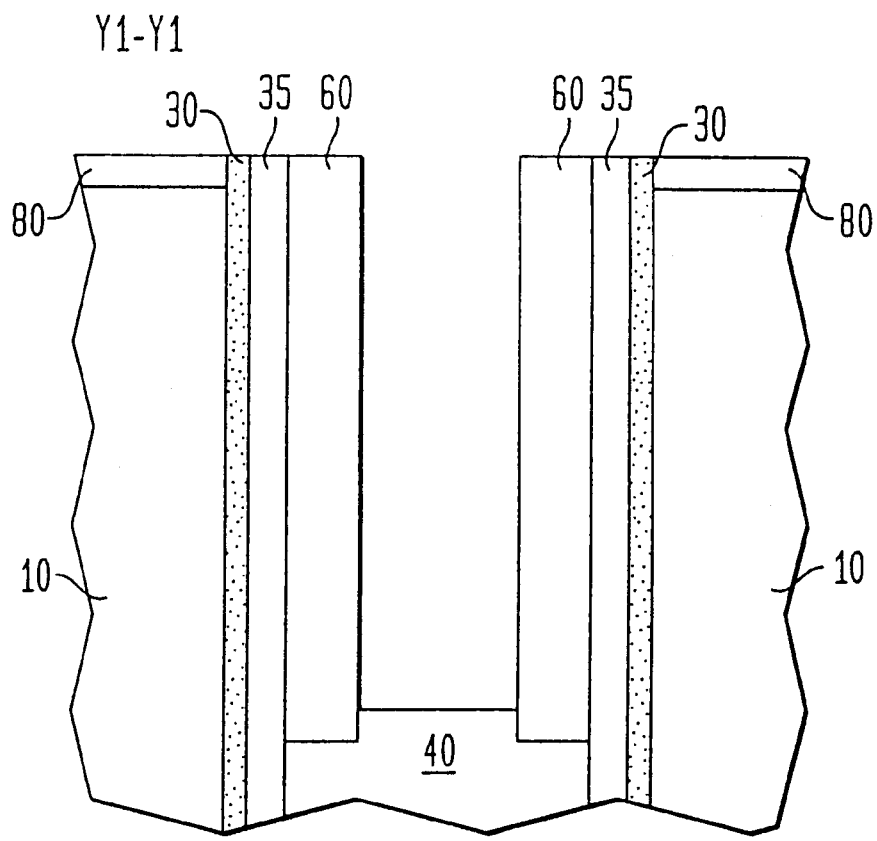
Figure 12C:
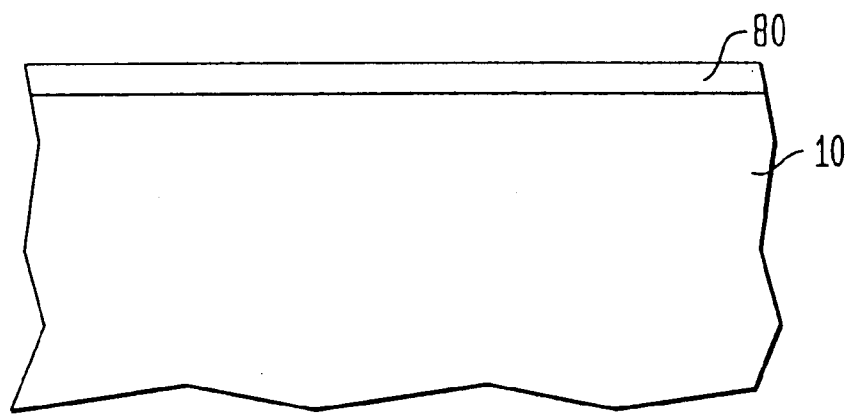
Figure 13A:
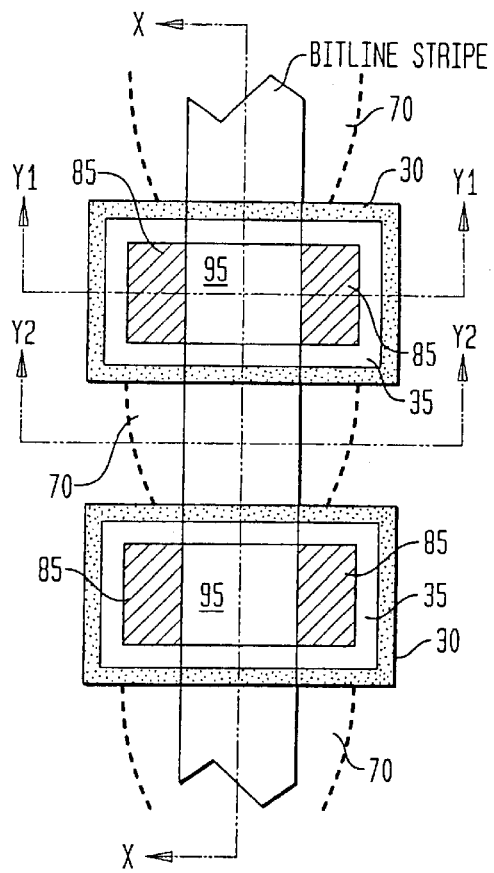
Figure 13B:
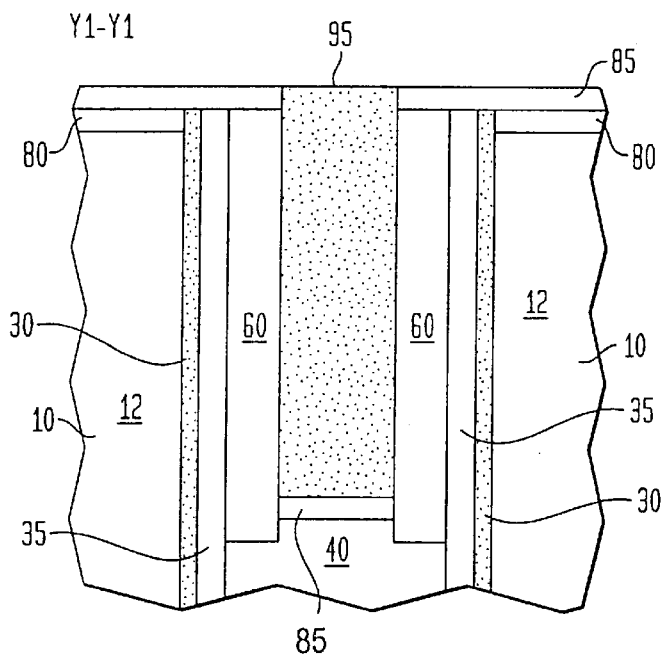
Figure 13C:
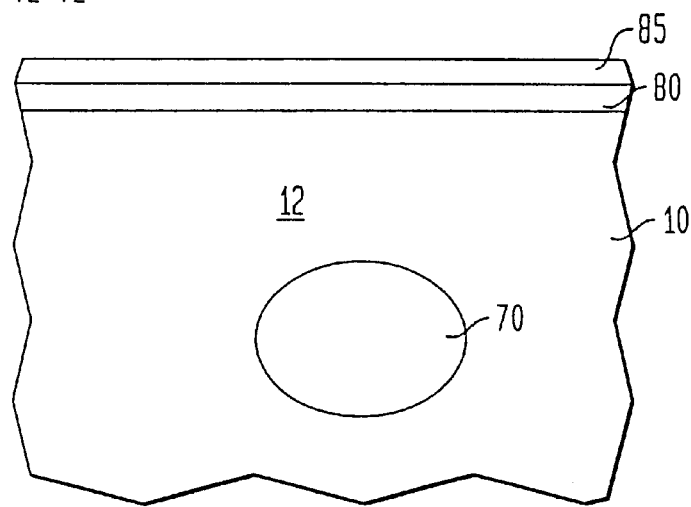
Figure 13D:
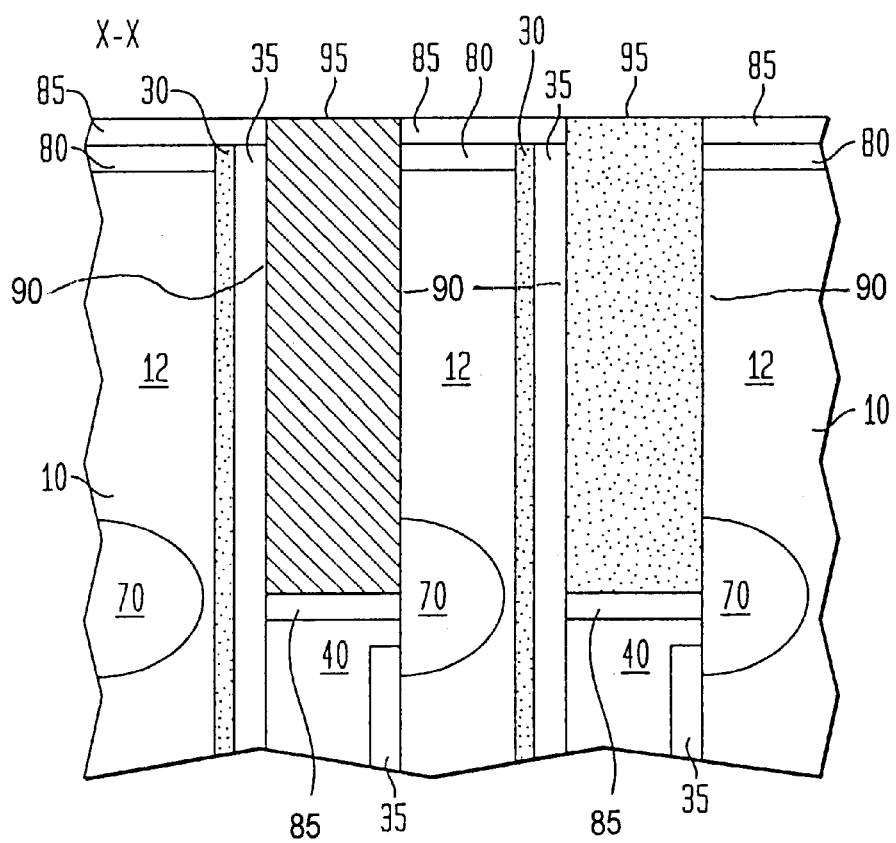
Figure 14A:
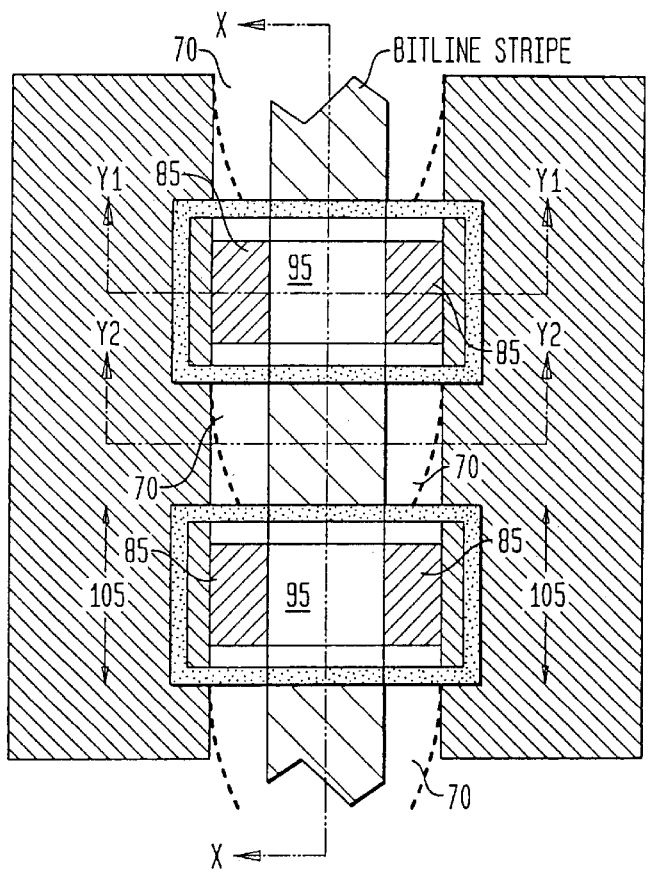
Figure 14B:
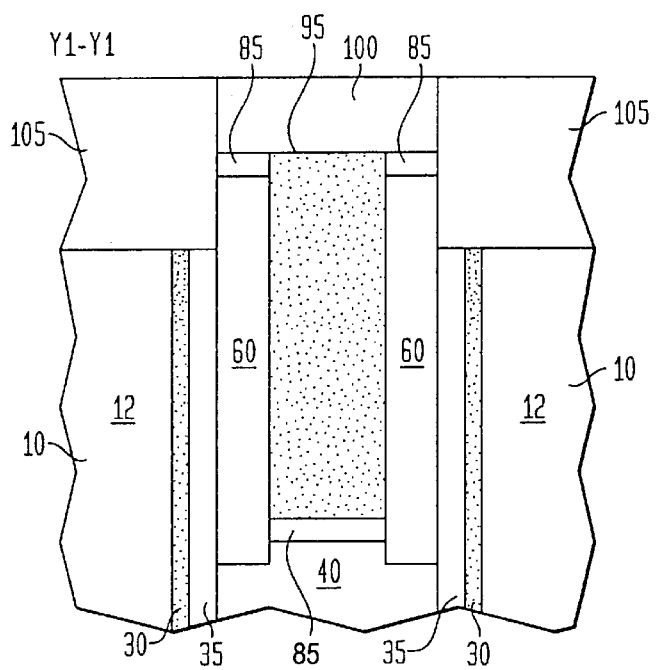
Figure 14C:
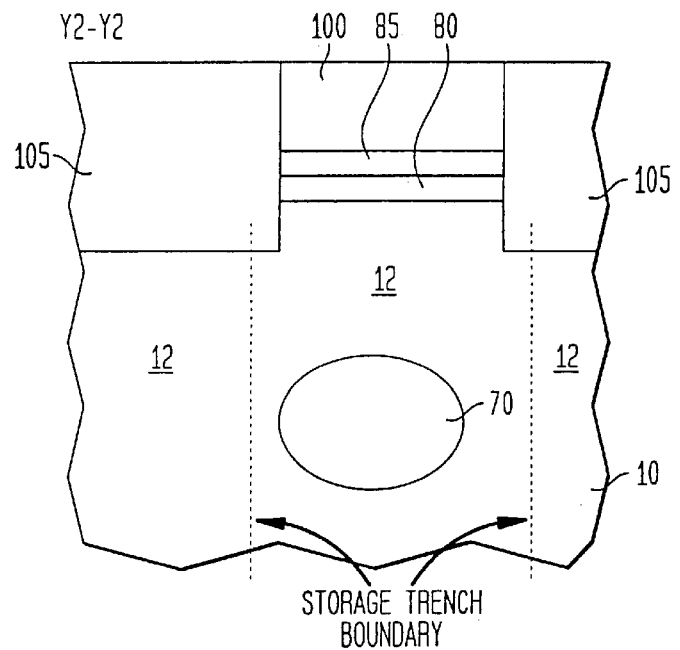
Figure 14D:
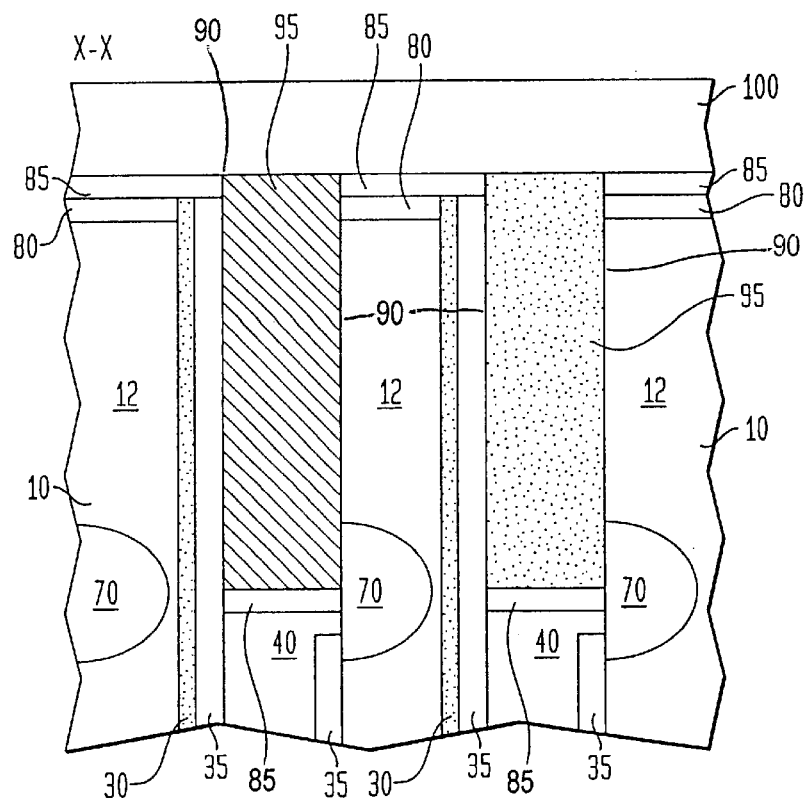
Figure 15A:
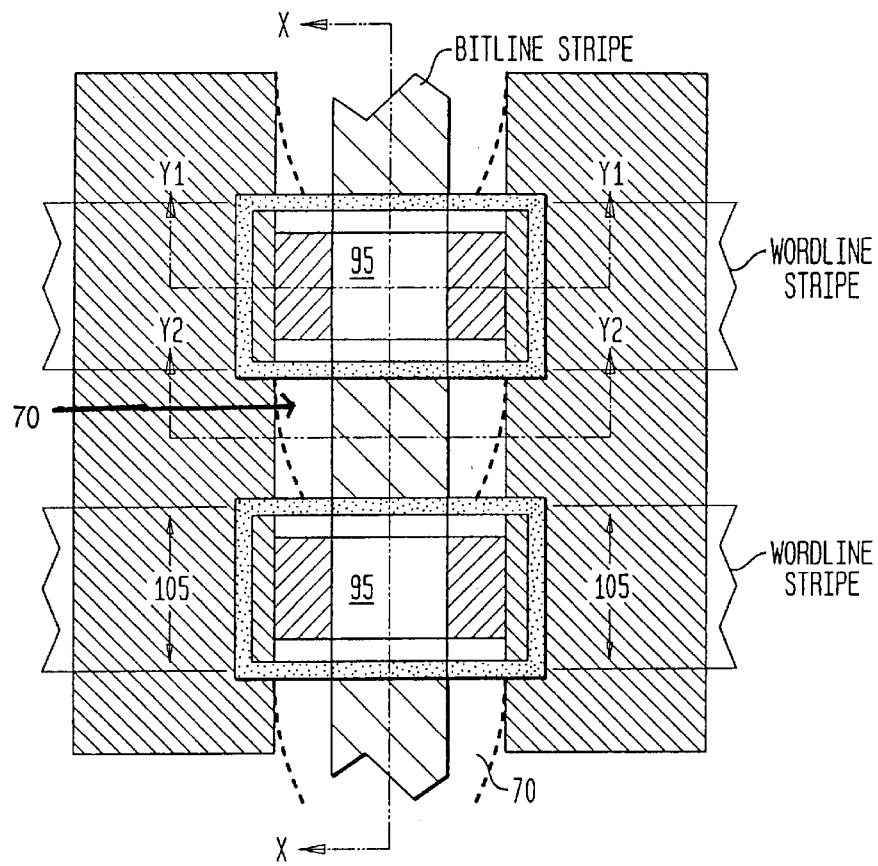
Figure 15B:
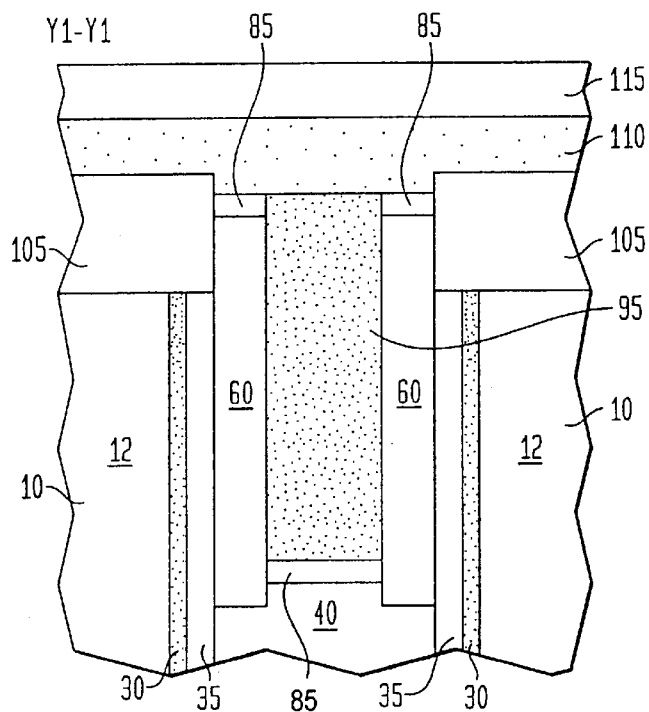
Figure 15C:
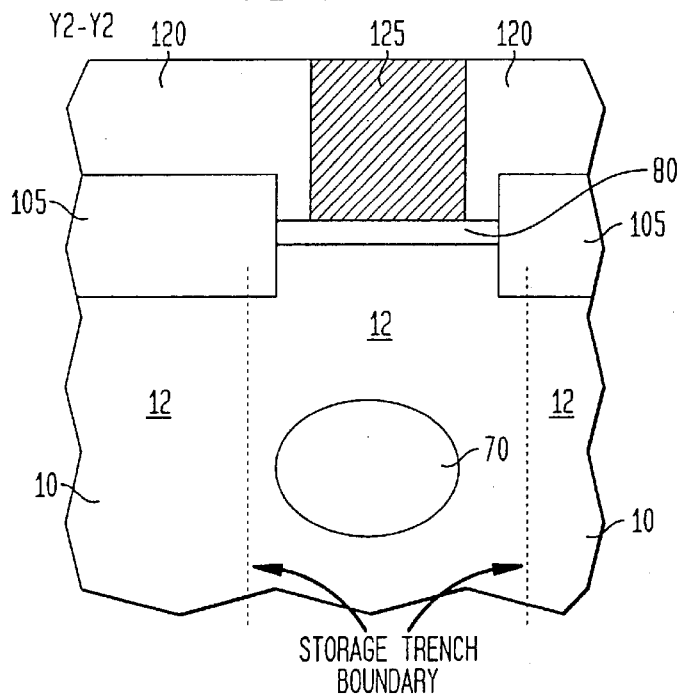
Figure 15D:
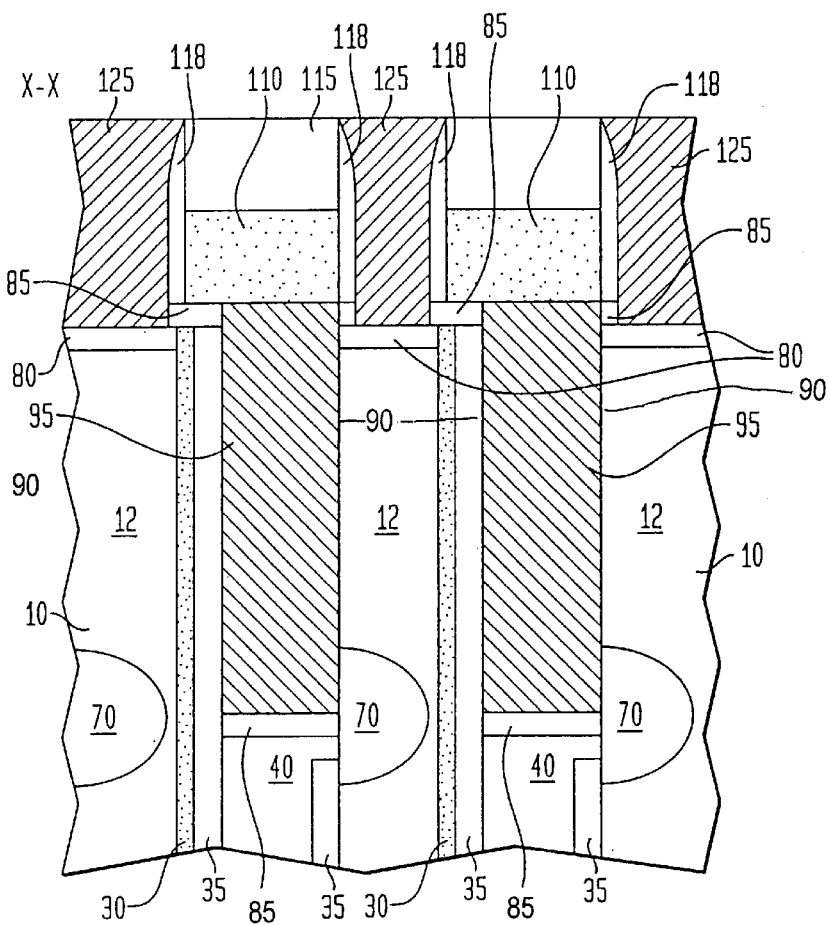

The exposed oxide and nitride layers not protected by the photoresist are now removed by utilizing an anisotropic etching process so as to expose the top surface of the Si-containing substrate. The photoresist is then removed utilizing a conventional stripping process so as to expose the top surface of the deep trench polysilicon. A screen oxide (not shown) for the implantation of the bitline diffusions is then grown and the bitline diffusions are implanted by conventional means well known to those skilled in the art forming bitline diffusion regions 80 adjacent to the deep trench region. These steps of the present invention are shown in FIGS. 12A, 12B, and 12C. Note that a block mask (not shown) is used to protect portions of the support areas during the bitline implant.

If not previously formed in the structure, one-sided buried-strap 70 can now be formed by utilizing any one of a variety of well known masked or maskless processes which are capable of removing the exposed portion of the collar oxide on one side of the aperture. The etching, which is typically carried out isotropically, continues such that a divot recess extending below the top of the deep trench polysilicon is formed in the collar oxide. This standard process continues with the deposition and isotropic etching of a layer of buried-strap polysilicon, thus plugging the divot in the collar oxide and forming an electrically conductive strap between the deep trench polysilicon and the exposed monocrystalline silicon on the sidewalls of the storage trench. A trench top oxide (TTO) 85 is then formed by conventional deposition or thermal growing processes on the top surface of the exposed substrate. Preferably, the TTO layer is formed by deposition of a HDP oxide. A gate oxide 90 is then thermally grown utilizing conventional growing processes well known in the art.

Degenerately N+ doped gate conductor polysilicon 95 is deposited so as to fill the aperture and then a conventional planarization process such as CMP is performed on the structure so as to planarize the structure to the top surface of the TTO. Following the planarization step, P-type implants which define the channel doping for the vertical MOSFETs are made through the TTO oxide. Note that during subsequent hot processing steps, including sacrificial oxidation, gate oxidation and anneals, the dopant from the deep trench polysilicon diffuses into the Si-containing substrate in the strap opening previously defined on the sidewall of the storage trench. The above processing steps result in the structure shown in FIGS. 13A, 13B, 13C, and 13D. A new nitride layer (SIT masking layer) 100 is next deposited by conventional means well known in the art. SIT regions 105 are then defined, filled and planarized, using standard well known techniques, See FIGS. 14A, 14B, 14C and 14D. Unlike the conventional hybrid cells which require very deep STI regions to cut the strap diffusion, the inventive technique only requires that the SIT regions be deeper than the bitline diffusion and source and drain diffusions in the supports. 150 nm is sufficient for isolation, greatly facilitating the etching and filling process relative to 500 nm deep STI used in conventional hybrid cells. It is noted that in the inventive memory cell, the SIT regions have a depth of from about 100 to about 300 nm, and are typically spaced about 1 F from each other. Preferably, the SIT width is about 2 F, which permits the formation of bitlines having approximately a 3 F pitch.

The new nitride layer is now removed from the supports area. Standard processing in -the supports-follows which includes sacrificial oxidation and well implants, gate-oxidation, support gate conductor deposition and implantation to set work functions. Following gate conductor implantation in the supports, the remaining new nitride layer is stripped from the array, conductor layer 110 (e.g., WN/W or WSi$_x$) and an insulating cap, e.g., SiN, 115 are deposited and patterned so as to form wordlines. Standard processing continues with the formation of wordline conductors and support gate conductor sidewall spacers 118 and source/drain implants. Interlevel dielectric 120 such as boron phosphorus doped silicate glass (BPSG) is deposited and contact vias are formed in the interlevel dielectric. Contacts studs are formed in the array and in the supports. FIGS. 15A, 15B, 15C and 15D show the cell structure after the bitline contacts 125 (borderless bitline contacts) have been planarized. Standard processing continues through the final levels of metallization. It is noted that the bitlines are formed over and orthogonal to the wordlines described above utilizing conventional processing techniques well known to those skilled in the art. In summary, the above process steps results in the formation of a hybrid-type cell (6 F$^2$) which avoids strap-to-strap leakage problems to F=60 nm at $V_{blh}$=1.5 V. Moreover, the inventive process results in a well contact scheme which eliminates the floating-well effects which limit the scaling of the conventional hybrid cell. Furthermore, the inventive process uses shallow isolation trenches throughout the chip (array and supports) for reduced aspect ratio and ease of fabrication, and it allows for tighter support circuitry groundrules due to smaller aspect ratio SITs. Additionally, the inventive process provides limited area strap aperture defined by side-oxide regions in the storage trench which results in reduced sensitivity to the channel width, and it allows spacing between SIT regions greater than about 1 F, if desired, without critical overlay concerns since the strap cut is no longer defined by the isolation trench region.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the letters patent is:

1. A memory cell array comprising:
   a pluraity of vertical memory cells which are arranged in rows and columns, each vertical memory cell being located in a storage trench that is present in a P-well of a Si-containing substrate and each vertical memory cell includes a MIOSFET region which comprises at least a gate oxide formed over a storage capacitor, said MOSFET region and said storage capacitor being electrically connected by a one-sided buried-strap outdifision region, said one-sided buried-strap outdifffusion region being confined to a substanfally center portion of the storage trench, wherein the one-sided buried-strap outdiffusion region and the gate oxide lie within a common aperture that is located on a single side of the storage trench, and
   shallow isolation trench regions located between adjacent columns of memory cells so as to separate columns of memory cells, each of said shallow isolation trench regions having a depth that is substantially above said one-sided buried-strap outdiffusion region thereby not cutting into said one-sided buried-strap outdiffiusion region, yet being deep enough to isolate adjacent bitline diffusion regions that abut each vertical DRAM cell.

2. The memory cell array of claim 1 further comprising bitlines which are located vertically over the storage trench.

3. The memory cell array of claim 2 wherein said bitlines have an approximately 3 F pitch.

4. The memory cell array of claim 2 wherein said bitlines are in electrical contact with said bitline diffusion regions through borderless bitline contact regions.

5. The memory cell array of claim 1 further comprising wordlines.

6. The memory cell array of claim 5 wherein said wordlines are formed over each vertical memory cell.

7. The memory cell array of claim 5 wherein said wordlines comprise a wordline gate conductor and a top insulating cap.

8. The memory cell array of claim 7 wherein said wordline gate conductor is WN/W or WSi$_x$.

9. The memory cell array of claim 7 wherein said top insulating cap is comprised of SiN.

10. The memory cell array of claim 5 wherein said wordlines include spacers formed on sidewalls thereof.

11. The memory cell array of claim 1 wherein said cells are each about 6 F.

12. The memory cell array of claim 1 wherein said array is scalable to a minimum feature size, F, of about 60 nm at an operating voltage of about 1.5 V without occurring strap-to-strap leakage.

13. The memory cell array of claim 1 wherein said shallow isolation trench regions are spaced apart from each other by a distance of about 1 F.

14. The memory cell array of claim 1 wherein said shallow isolation trench regions have a depth of from about 100 to about 300 nm.

* * * * *